United States Patent
Akaike et al.

(10) Patent No.: US 9,019,027 B2
(45) Date of Patent: *Apr. 28, 2015

(54) OSCILLATION DEVICE

(71) Applicant: Nihon Dempa Kogyo Co., Ltd., Tokyo (JP)

(72) Inventors: Kazuo Akaike, Saitama (JP); Tsukasa Kobata, Saitama (JP); Shinichi Sato, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/037,400

(22) Filed: Sep. 26, 2013

(65) Prior Publication Data

US 2014/0085015 A1    Mar. 27, 2014

(30) Foreign Application Priority Data

Sep. 27, 2012    (JP) .................. 2012-214196

(51) Int. Cl.
*H03B 5/32*    (2006.01)
*H03L 1/04*    (2006.01)
*H03L 1/02*    (2006.01)
*H03L 7/18*    (2006.01)

(52) U.S. Cl.
CPC . *H03L 1/04* (2013.01); *H03L 1/026* (2013.01); *H03L 1/027* (2013.01); *H03L 7/18* (2013.01)

(58) Field of Classification Search
CPC ...................................... H03L 1/026
USPC .................. 331/176, 158, 116 R, 116 FE
See application file for complete search history.

(56) References Cited

U.S. PATENT DOCUMENTS 8,729,978 B2 *    5/2014    Akaike et al. ............ 331/176

FOREIGN PATENT DOCUMENTS

| JP | 2001-292030 | 10/2001 |
|----|-------------|---------|
| JP | 2013-051676 | 3/2013  |
| JP | 2013-051677 | 3/2013  |
| JP | 2013-098872 | 5/2013  |

* cited by examiner

*Primary Examiner* — Arnold Kinkead
(74) *Attorney, Agent, or Firm* — Jianq Chyun IP Office

(57) ABSTRACT

An oscillation device is provided. The oscillation device includes: a main circuit portion, a heating unit, first and second crystal units, first and second oscillator circuits, a frequency difference detector, a first addition unit, an integration circuit unit, a circuit unit configured to control an electric power to be supplied to the heating unit, a compensation value obtaining unit, and a second addition unit. The compensation value obtaining unit is configured to obtain a frequency compensation value for compensating an output frequency of the main circuit portion based on an integrated value output from the integration circuit unit, and based on a change in the clock signal due to a difference between the temperature of the atmosphere and the temperature setting value of the heating unit. The second addition unit is configured to add the frequency compensation value to a frequency setting value.

11 Claims, 15 Drawing Sheets

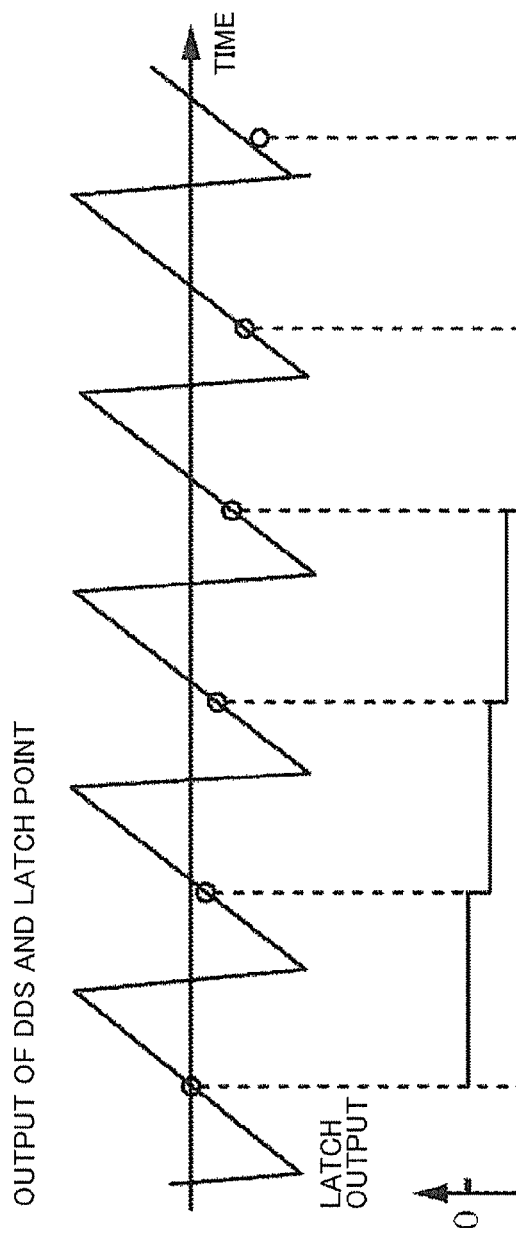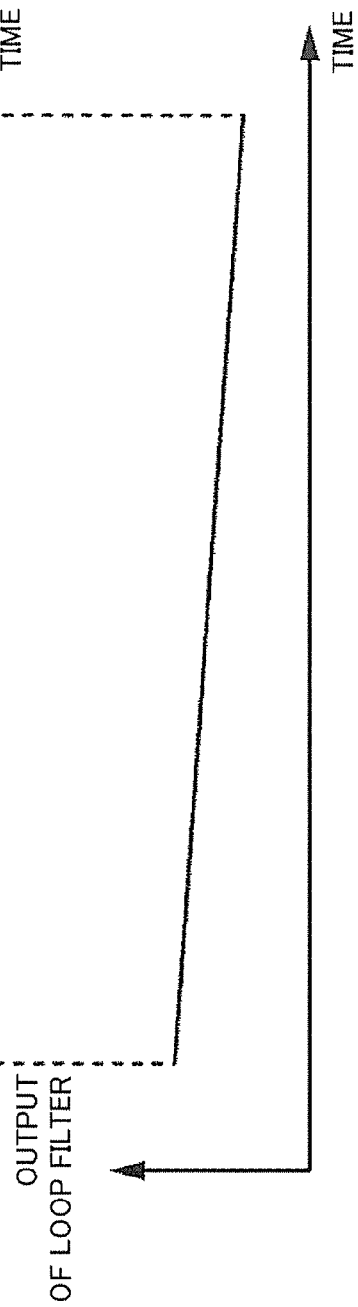
FIG. 4A
FIG. 4B
FIG. 4C

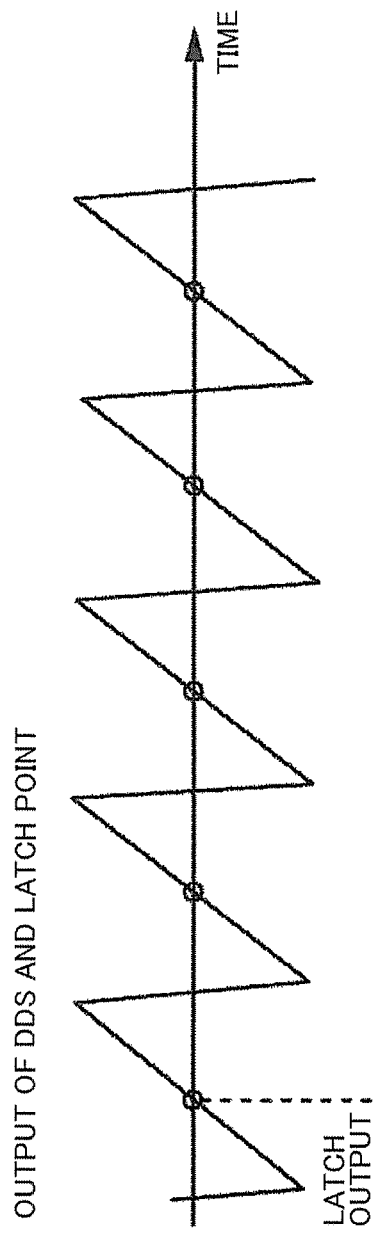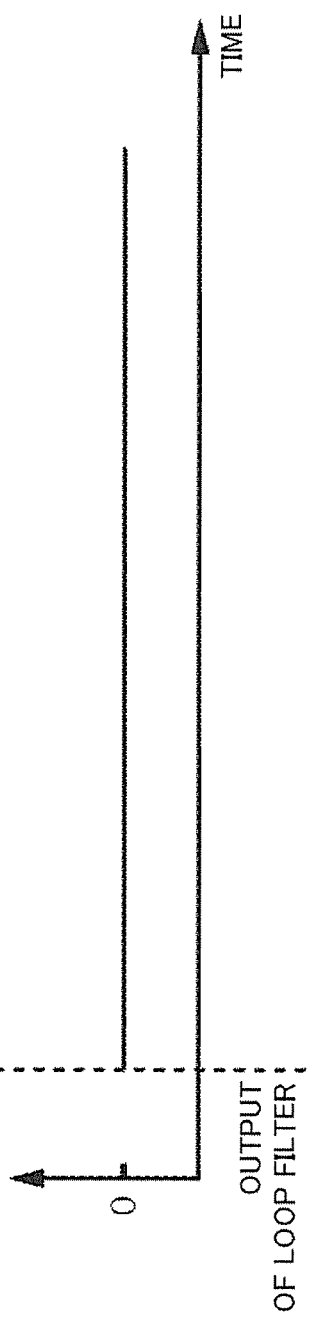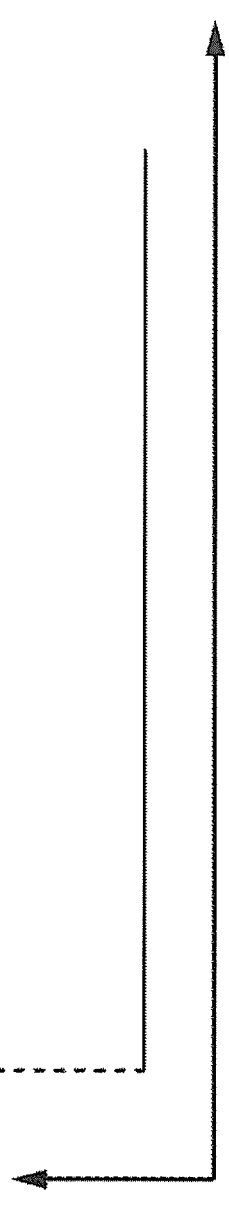

OSCILLATION DEVICE

CROSS-REFERENCE TO RELATED APPLICATION

This application claims the priority benefit of Japanese application serial no. 2012-214196, filed on Sep. 27, 2012. The entirety of the above-mentioned patent application is hereby incorporated by reference herein and made a part of specification.

BACKGROUND

1. Technical Field

The present disclosure relates to an oscillation device that includes a PLL for generating an oscillation output corresponding to a frequency setting value, based on a clock signal generated during adjustment of a temperature of an atmosphere where a crystal unit is placed.

2. Description of the Related Art

In the case where a crystal controlled oscillator is incorporated into an oscillation device requiring extremely high frequency stability, an oven controlled crystal oscillator (OCXO) is typically used. Temperature control of the OCXO is performed with a configuration that employs a thermistor as a temperature sensor and discrete parts such as an operational amplifier, a resistor, and a capacitor. However, a temperature control within, for example, ±20 m° C. cannot be performed due to variation and aging of individual analog parts.

However, for example, a base station and a relay station require use of a clock signal with extremely high stability at low price. Consequently, the conventional OCXO is expected to have difficulty in dealing with some situations. Especially, even when the temperature control is performed like in the OCXO, for example, in the case where change in temperature of the atmosphere where the crystal controlled oscillator is placed occurs based on rapid change in external temperature or a trouble occurs in the temperature control, this may cause decrease in stability of frequency.

FIG. 2 and FIG. 3 of Japanese Unexamined Patent Application No. 2001-292030 disclose that two pairs of electrodes are disposed on the common crystal element to constitute two crystal units (crystal resonators). The paragraph (0018) discloses that a frequency difference appears between the two crystal units corresponding to a temperature change and therefore measuring this frequency difference is equivalent to measuring the temperature. The ROM stores the relationship between the frequency difference $\Delta f$ and the compensation amount of frequency. The compensation amount of frequency is read out based on $\Delta f$.

However, this method relates to a temperature compensated crystal oscillator (TCXO) that compensates an oscillation frequency based on temperature detection, but does not relate to the OCXO.

As disclosed in the paragraph (0019), it is necessary to adjust the crystal units such that the desired output frequency f0 and the respective frequencies f1 and f2 of the two crystal units satisfy the relationship of f0≈f1≈f2. Therefore, a problem arises in that this complicates the production process of the crystal unit and does not provide high yield. Additionally, the clock that is the frequency signal from each crystal unit is counted for a certain period of time to obtain the difference (f1−f2). The detection time is directly affected by the detection accuracy. Therefore, it is difficult to perform temperature compensation with high accuracy.

The present disclosure is made under such a background, and provides an oscillation device that obtains an oscillation output with high frequency stability regarding an oscillation device that includes a crystal oscillator (OCXO) that detects a temperature of an atmosphere where a crystal unit is placed and controls a heating unit based on a result of the detection to have a constant temperature of the atmosphere.

SUMMARY

An oscillation device according to the present disclosure includes: a main circuit portion that includes a phase locked loop (PLL), the main circuit portion is configured to generate an oscillation output of the oscillation device corresponding to a frequency setting value, the main circuit portion uses an output of an oscillator circuit for outputting a clock as a clock signal, the oscillator circuit is connected to a crystal unit; a heating unit configured to ensure a constant temperature of an atmosphere where the crystal unit is placed; a first crystal unit that includes a crystal element where a first electrode is disposed; a second crystal unit that includes a crystal element where a second electrode is disposed; a first oscillator circuit connecting to the first crystal unit; a second oscillator circuit connecting to the second crystal unit; a frequency difference detector configured to obtain, as a temperature detection value, a value corresponding to a difference value between: a value corresponding to a difference between f1 and f1r; and a value corresponding to a difference between f2 and f2r, where f1 is an oscillation frequency of the first oscillator circuit, f1r is an oscillation frequency of the first oscillator circuit at a reference temperature, f2 is an oscillation frequency of the second oscillator circuit, and f2r is an oscillation frequency of the second oscillator circuit at the reference temperature; a first addition unit configured to extract a deviation amount between a temperature setting value of the heating unit and the temperature detection value; an integration circuit unit configured to integrate a deviation amount extracted by the first addition unit and output an integration result; a circuit unit configured to control an electric power to be supplied to the heating unit based on an integrated value output from the integration circuit unit; a compensation value obtaining unit configured to obtain a frequency compensation value for compensating an output frequency of the main circuit portion based on an integrated value output from the integration circuit unit, and based on a change in the clock signal due to a difference between the temperature of the atmosphere and the temperature setting value of the heating unit; and a second addition unit configured to add the frequency compensation value to the frequency setting value.

The above-described oscillation device may have the following features.

(a) The oscillator circuit for outputting the clock also functions as one of the first oscillator circuit and the second oscillator circuit.

(b) The value corresponding to the difference value between: the value corresponding to the difference between f1 and f1r; and the value corresponding to the difference between f2 and f2r, is $\{(f2-f2r)/f2r\}-\{(f1-f1r)/f1r\}$.

(c) The first oscillator circuit and the second oscillator circuit each output an overtone as the oscillation output.

(d) The main circuit portion includes a DDS (direct digital synthesizer) circuit unit configured to output a frequency signal to a phase frequency comparator of the PLL.

The frequency signal is generated based on the clock signal and the compensated frequency setting value.

(e) The compensation value obtaining unit is configured to decimate the output of the frequency compensation value at a predetermined interval, such that an interval to add the frequency compensation value to the frequency setting value by the second addition unit becomes longer than an interval to output the integrated value by the integration circuit unit.

The present disclosure allows compensating the frequency setting value to be input to the main circuit portion including the PLL using the frequency compensation value obtained from the integrated value of the integration circuit unit corresponding to the temperature of the atmosphere where the crystal unit is placed, thus ensuring an oscillation output with high stability by cancelling the influence by a change in the temperature of the atmosphere.

BRIEF DESCRIPTION OF THE DRAWINGS

FIG. 4A to FIG. 4C are waveform diagrams of respective portions schematically illustrating a state where a loop including a DDS circuit unit illustrated in FIG. 2 is not locked.

FIG. 5A to FIG. 5C are waveform diagrams of respective portions schematically illustrating a state where the loop including the DDS circuit unit illustrated in FIG. 2 is locked.

DETAILED DESCRIPTION

Figure 1:
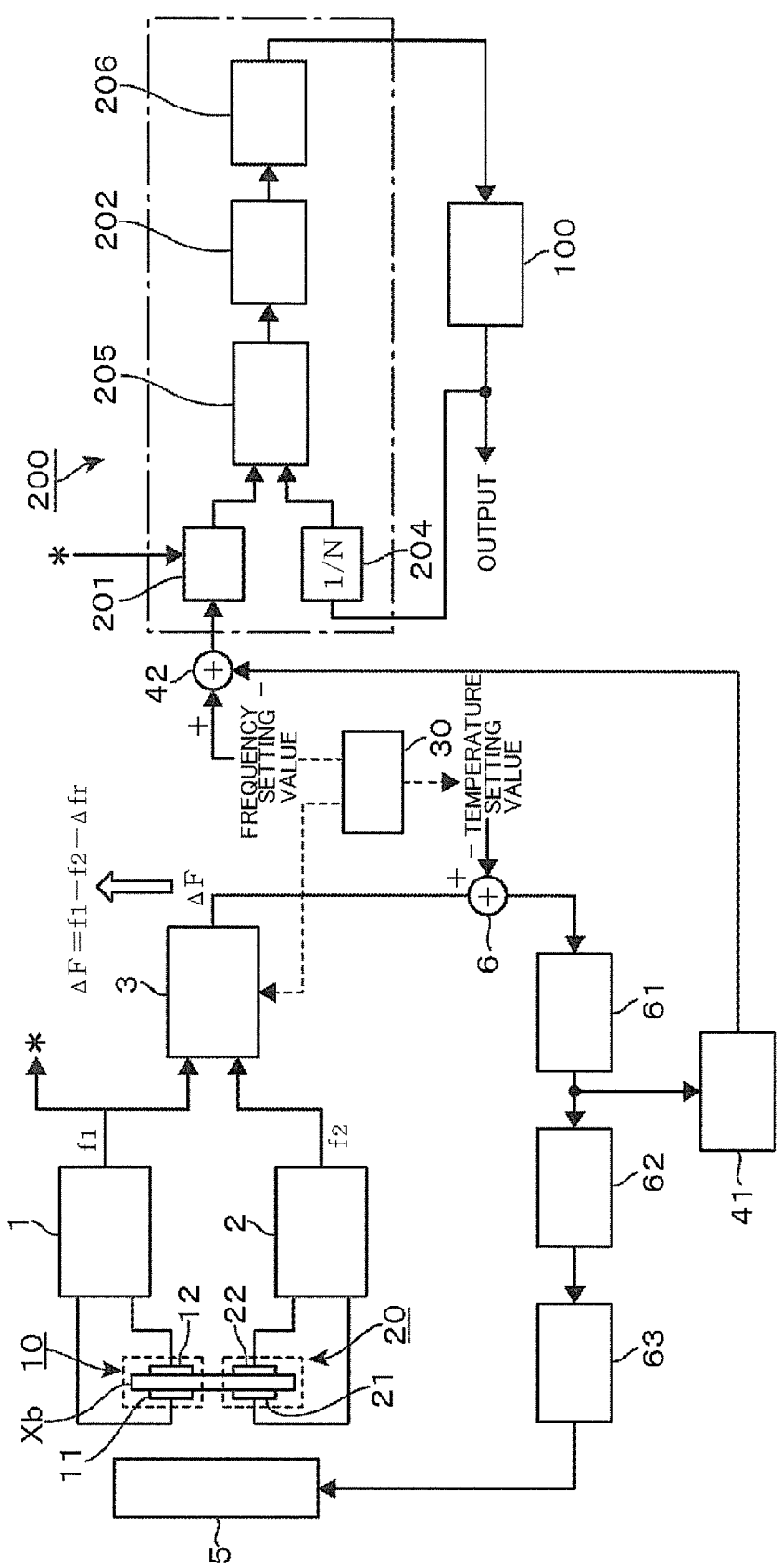
FIG. 1 is a block diagram illustrating an entire configuration of an embodiment of the present disclosure.

FIG. 1 is a block diagram illustrating an entire oscillation device according to an embodiment of the present disclosure. This oscillation device is constituted as a frequency synthesizer that outputs a frequency signal (an oscillation output) at a set frequency. The oscillation device includes a voltage control oscillator 100 employing a crystal unit, a control circuit unit 200 (a main circuit portion), which constitutes PLL for the voltage control oscillator 100, a crystal controlled oscillator (a reference numeral is not given), and a heater circuit 5 as a heating unit. The crystal controlled oscillator generates a clock signal to operate a DDS circuit unit 201 that generates a reference signal of the PLL. The heater circuit 5 adjusts the temperature (hereinafter referred to as environmental temperature) of atmosphere where crystal units 10 and 20 are placed in this crystal controlled oscillator. Hence, the crystal controlled oscillator is OCXO.

The oscillation device also has a function for performing temperature compensation on an output frequency which is output from the control circuit unit 200. Although a circuit section for performing temperature compensation is not labeled with a reference numeral, this circuit section is equivalent to a left section than the control circuit unit 200 in FIG. 1, and is also used as the circuit section for controlling the heater circuit 5.

The control circuit unit 200 compares a reference signal (reference clock) with a phase of a clock by a phase frequency comparator 205. The reference signal is output from a direct digital synthesizer (DDS) circuit unit 201. The clock is formed by dividing an output of the voltage control oscillator 100 by a divider 204. A phase difference, which is a result of the comparison, is converted into an analog signal by a charge pump 202. The analog signal is input to a loop filter 206 and controlled to stabilize the phase locked loop (PLL). Therefore, the control circuit unit 200 includes the PLL. Here, the DDS circuit unit 201 employs a frequency signal output from a first oscillator circuit 1, which is described later, as the clock signal, and receives a frequency setting value (a digital value) for outputting a signal at an intended frequency.

However, a frequency (an oscillation frequency of the first oscillator circuit 1) of the clock signal has a temperature characteristic. To cancel an influence of the temperature characteristic that affects the oscillation output, an addition unit 42 adds a signal corresponding to a frequency compensation value, which is described later, to the frequency setting value to be input to the DDS circuit unit 201. The frequency setting value to be input to the DDS circuit unit 201 is compensated, so as to cancel the temperature variation amount of the frequency (hereinafter referred to as an output frequency) of the oscillation output to be output from the oscillation device based on the amount of temperature characteristic variation of the clock signal. Therefore, the output frequency from the voltage control oscillator 100 is stabilized.

In this embodiment, the crystal controlled oscillator that outputs the clock signal is constituted as an OCXO as described later. Therefore, the frequency of the clock signal is stabilized and the temperature characteristic of the clock signal does not appear. However, this embodiment has a configuration that compensates for a variation amount of the output frequency of the control circuit unit 200 based on a variation amount of the temperature characteristic of the clock signal. The variation amount of the temperature characteristic of the clock signal is due to, for example, occurrence of the failure of the heater or change in environmental temperature based on rapid change in external temperature. Therefore, an advantage that ensures a configuration of a frequency synthesizer with extremely high reliability is provided.

Next, a description will be given of the section of the OCXO equivalent to the crystal controlled oscillator of the present disclosure. This crystal controlled oscillator includes a first crystal unit 10 and a second crystal unit 20. The first crystal unit 10 and the second crystal unit 20 are constituted by using an AT-cut common crystal element Xb, for example. That is, a region of the crystal element Xb in a strip shape is divided into two regions in the longitudinal direction, for example. Electrodes for excitation are formed on both front and back surfaces of each divided region (a vibrating region). Then, the first crystal unit 10 is formed of one divided region and a pair of electrodes 11 and 12. Also, the second crystal unit 20 is formed of the other divided region and a pair of electrodes 21 and 22. Therefore, the first crystal unit 10 and the second crystal unit 20 are thermally connected.

A first oscillator circuit 1 and a second oscillator circuit 2 are respectively connected to the first crystal unit 10 and the second crystal unit 20. Respective outputs of the oscillator circuits 1 and 2 may be, for example, overtones (harmonics) of the crystal units 10 and 20, or may be fundamental waves. In the case where an overtone output is obtained, for example, a tuned circuit at the overtone may be disposed within the oscillation loop in order to oscillate the oscillation loop at the overtone, and the oscillation loop includes a crystal unit and an amplifier. Alternatively, the oscillation loop may be oscillated with the fundamental wave. In the latter part of the oscillation part, for example, the latter part of an amplifier that is a part of a Colpitts circuit, a class-C amplifier may be disposed to distort the fundamental wave by this class-C amplifier. Also, a tuned circuit may be disposed to be tuned at the overtone in the latter part of the class-C amplifier. As a result, both the oscillator circuits 1 and 2 may output, for example, oscillation frequency of the third overtone.

Here, for convenience, it is assumed that a frequency signal of the frequency f1 is output from the first oscillator circuit 1 while a frequency signal of the frequency f2 is output from the second oscillator circuit 2. The frequency signal of the frequency f1 is supplied to the control circuit unit 200 as the clock signal. In this respect, the first crystal unit 10 and the first oscillator circuit 1 are respectively equivalent to a crystal unit that outputs a clock signal and an oscillator circuit for outputting a clock. Here, the second oscillator circuit 2 may obviously be selected as the oscillator circuit for outputting the clock instead of the first oscillator circuit 1.

In FIG. 1, reference numeral 3 denotes a frequency difference detector. The frequency difference detector 3 is, to say schematically, a circuit unit to extract f2−f1−Δt which is a difference between: Δfr, and a difference between f1 and f2. Δfr is a difference between f1 (hereinafter referred to as f1r that is the oscillation frequency of the first oscillator circuit 1 at the reference temperature) and f2 (hereinafter referred to as f2r that is the oscillation frequency of the second oscillator circuit 2 at the reference temperature) at the reference temperature, for example, 25° C. Here, one exemplary difference between f1 and f2 is, for example, several MHz. The present disclosure is achieved by calculating ΔF, which is a difference between: a value corresponding to a difference between f1 and f2, and a value corresponding to a difference between f1 and f2 at the reference temperature, for example, 25° C. by the frequency difference detector 3. In the case of this embodiment, to be more specific, a value that can be obtained in the frequency difference detector 3 is {(f2−f1)/f1}−{(f2r−f1r)/f1r}. Note that in the drawing, indication of the output of the frequency difference detector 3 is abbreviated.

Figure 2:
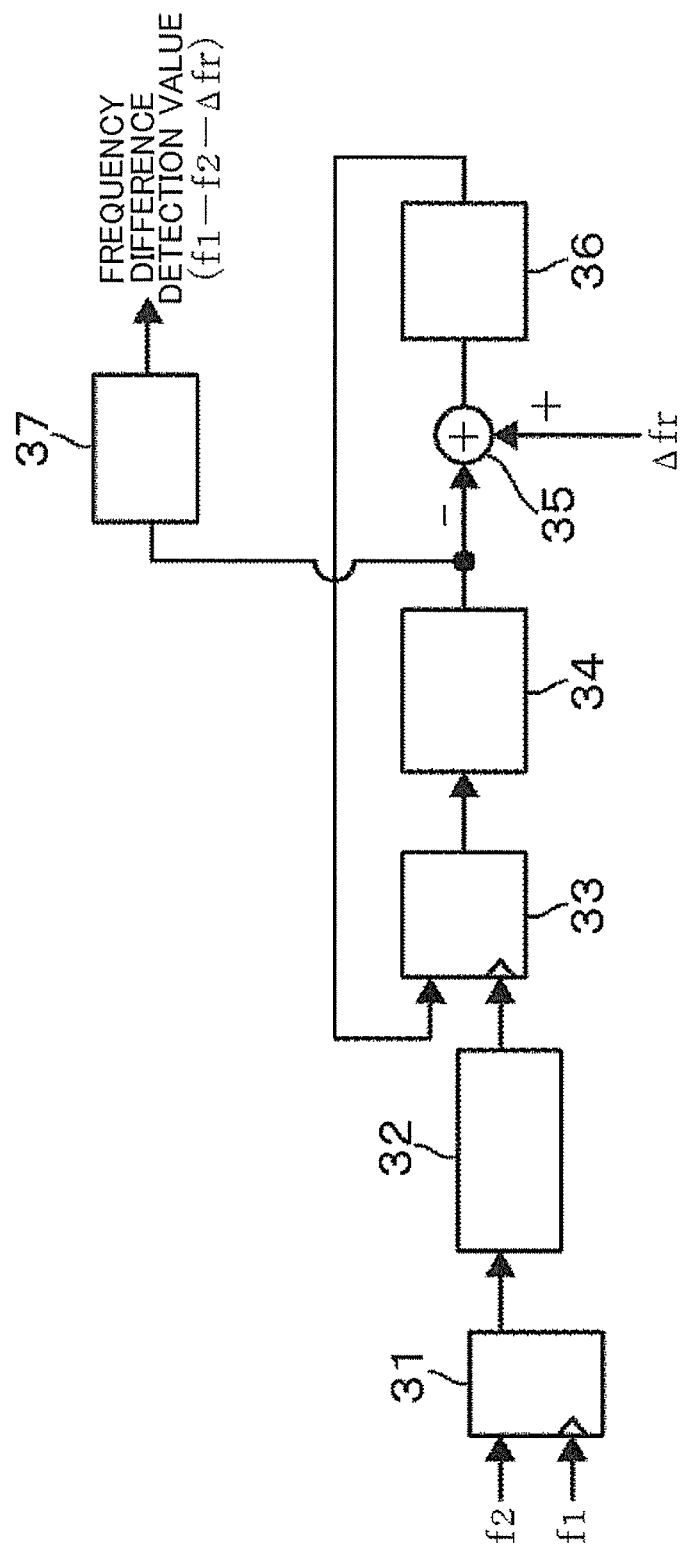
FIG. 2 is a block diagram illustrating a part of the embodiment of the present disclosure.

FIG. 2 illustrates a concrete example of the frequency difference detector 3. Reference numeral 31 denotes a flip-flop circuit (a F/F circuit). The frequency signal of the frequency f1 is input from the first oscillator circuit 1 to one input port of the flip-flop circuit 31. The frequency signal of the frequency f2 is input from the second oscillator circuit 2 to the other input port of the flip-flop circuit 31. The frequency signal of the frequency f2 from the second oscillator circuit 2 is latched with the frequency signal of the frequency f1 from the first oscillator circuit 1. To avoid redundancy of description, hereinafter f1 and f2 are treated as representing a frequency or the frequency signal itself. The flip-flop circuit 31 outputs a signal with a frequency (f2−f1)/f1, which is a value corresponding to a frequency difference between f1 and f2.

Figure 3:
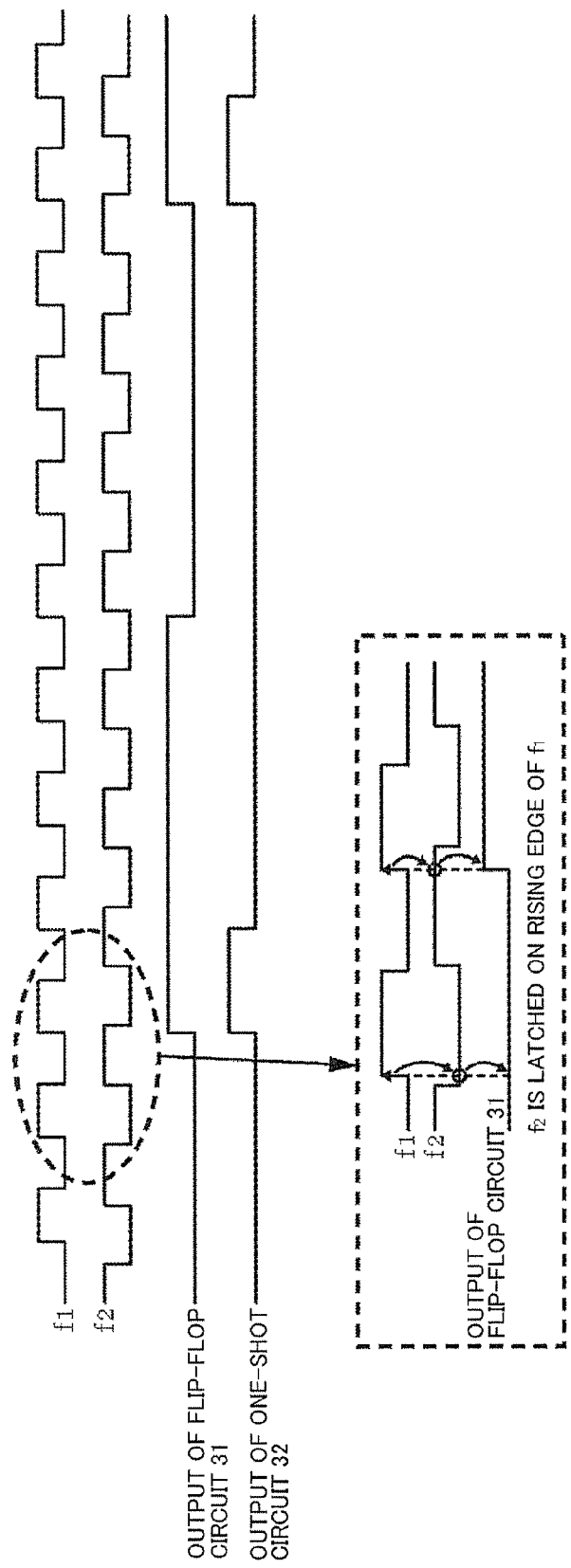
FIG. 3 is a waveform diagram illustrating an output from the part illustrated in FIG. 2.

A one-shot circuit 32 is disposed in the latter part of the flip-flop circuit 31. The one-shot circuit 32 outputs a one-shot pulse on the rising edge of the pulse signal obtained from the flip-flop circuit 31. FIG. 3 is a timing chart illustrating a sequence of signals up to now.

Phase locked loop (PLL) is disposed in the latter part of the one-shot circuit 32. This PLL includes a latch circuit 33, a loop filter 34 with an integration function, an addition unit 35, and a DDS circuit unit 36. The latch circuit 33 latches a sawtooth wave output from the DDS circuit unit 36 with a pulse output from the one-shot circuit 32. An output from the latch circuit 33 has a signal level of the sawtooth wave at a time point of the pulse output. The loop filter 34 integrates a DC voltage at this signal level. The addition unit 35 adds this DC voltage to a DC voltage corresponding to Δfr (the difference between f1 (f1r) and f2 (f2r) at the reference temperature, for example, 25° C.). The data of the DC voltage corresponding to Δft is stored in a memory 30 illustrated in FIG. 1.

In this example, respective signs at the addition unit 35 are set to "+" at an input side of the DC voltage corresponding to Δfr and "−" at an input side of the output voltage of the loop filter 34. The DDS circuit unit 36 receives a voltage, which is a DC voltage operated by the addition unit 35, that is, a voltage where an output voltage of the loop filter 34 is subtracted from a DC voltage corresponding to Δfr. The sawtooth wave with a frequency corresponding to this voltage value is output. For easy understanding of the operation of the PLL, FIG. 4A to FIG. 4C very schematically illustrate a state of an output from each portion, and a very schematic description will be provided for intuitive grasp. At the time of startup of the device, a DC voltage corresponding to Δfr is input to the DDS circuit unit 36 through the addition unit 35. For example, assume that Δfr is 5 MHz, a sawtooth wave with a frequency corresponding to this frequency is output from the DDS circuit unit 36.

The sawtooth wave is latched by a pulse of a frequency corresponding to (f2−f1) with the latch circuit 33. Assuming that (f2−f1) is, for example, 6 MHz, since a period of a pulse for the latch is shorter than a period of the sawtooth wave, the latch point of the sawtooth wave gradually decreases as illustrated in FIG. 4A. An output from the latch circuit 33 and an output from the loop filter 34, as respectively illustrated in FIG. 4B and FIG. 4C, gradually decrease toward the minus side. Since the sign of the output side of the loop filter 34 in the addition unit 35 is "−", a DC voltage input from the addition unit 35 to the DDS circuit unit 36 increases. Accordingly, the frequency of the sawtooth wave output from the DDS circuit unit 36 becomes high. When a DC voltage corresponding to 6 MHz is input to the DDS circuit unit 36, the frequency of the sawtooth wave becomes 6 MHz, and the PLL is locked as illustrated in FIG. 5A to FIG. 5C. Here, a DC voltage output from the loop filter 34 is a value corresponding to Δfr−(f2−f1)=−1 MHz. That is, an integrated value of the loop filter 34 corresponds to an integrated value of a variation amount of 1 MHz when a frequency of the sawtooth wave changes from 5 MHz to 6 MHz.

Figure 6A:
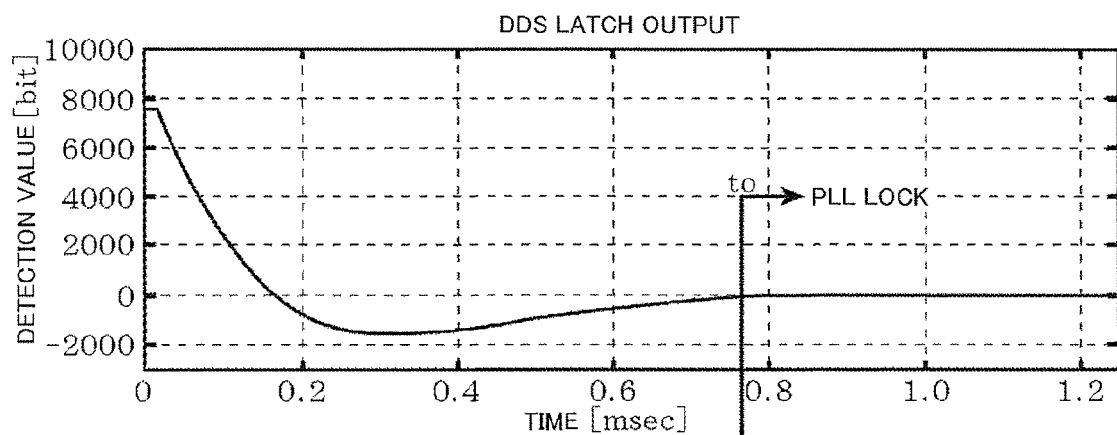
FIG. 6A and FIG. 6B are waveform diagrams of respective portions in the loop according to an actual device corresponding to the embodiment.
Figure 6B:
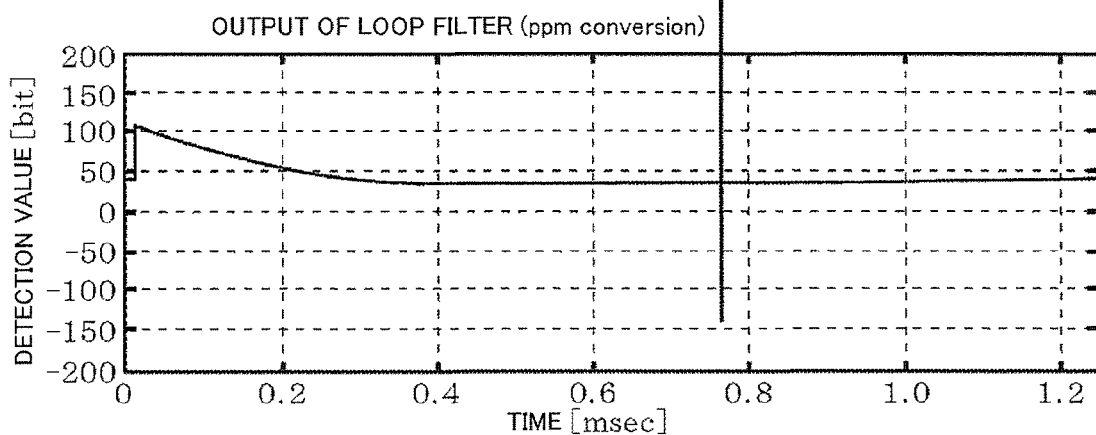

Contrary to this example, in the case where Δfr is 6 MHz and (f2−f1) is 5 MHz, since the period of the pulse for the latch is longer than that of the sawtooth wave, the latch point illustrated in FIG. 4A gradually increases. Accordingly, an output of the latch circuit 33 and an output of the loop filter 34 also increase. Therefore, a value subtracted by the addition unit 35 becomes larger, and this causes gradual decrease in the frequency of the sawtooth wave. Eventually, when the frequency becomes 5 MHz, which is equal to (f2−f1), the PLL is locked. Then, a DC voltage output from the loop filter 34 is a value corresponding to Δfr−(f2−f1)=1 MHz. Here, FIG. 6A and FIG. 6B show measurement data. In this example, the PLL is locked at a time t0.

Meanwhile, as described above, the actual output from the frequency difference detector 3, that is, an output from an averaging circuit 37 illustrated in FIG. 2, is a value where the value of $\{(f2-f1)/f1\}-\{(f2r-f1r)/f1r\}$ is expressed in a 34-bit digital value. Assume that the collection of this value from near −50° C. to near 100° C. is (f1−f1r)/f1r=OSC1 (the unit is ppm or ppb) and (f2−f2r)/f2r=OSC2 (the unit is ppm or ppb), a variation relative to the temperature forms practically the same curve as OSC2−OSC1. Accordingly, an output (in other words, frequency deviation information corresponding to a temperature variation amount from the reference temperature) from the frequency difference detector 3 can be treated as OSC2−OSC1=temperature data.

A latch operation of f2 by f1 in the flip-flop circuit 31 is asynchronous. Hence, an indefinite period such as a metastable state (When input data is latched at a time point of an edge of a clock, the input data needs to be held for a certain period of time before and after the edge at the time point of the latch. The metastable state is a state where an output is destabilized by changing the clock and the input data approximately simultaneously) may occur. There is a possibility that an instantaneous error is included in an output from the loop filter 34. Therefore, the averaging circuit 37, which is a circuit obtaining a moving average of an input value at a predetermined time, is disposed at an output side of the loop filter 34 to remove the instantaneous error if the error even occurs. The provided averaging circuit 37 allows finally obtaining the frequency deviation information of the temperature variation amount with high accuracy. However, the configuration without the averaging circuit 37 is also possible.

Figure 7:
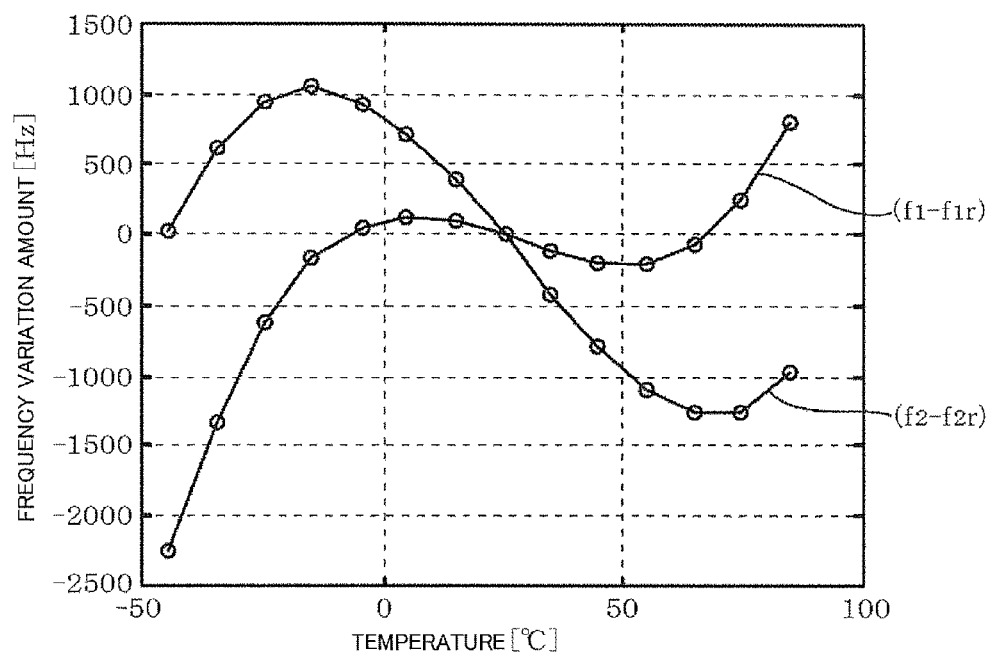
FIG. 7 is a frequency versus temperature characteristic graph illustrating a relationship between: a temperature, and a frequency f1 of a first oscillator circuit and a frequency f2 of a second oscillator circuit.

Here, a description will be given of OSC2−OSC1, which is frequency deviation information of a temperature variation amount obtained at the loop filter 34 of the PLL, with reference to FIG. 7 to FIG. 10. FIG. 7 is a characteristic diagram illustrating a relationship between temperature and frequency where f1 and f2 are normalized by the reference temperature. Here, "normalized" means obtaining the relationship between an amount of frequency deviation from the frequency at the reference temperature and temperature assuming that a reference temperature is set, for example, at 25° C. and a frequency at the reference temperature is regarded as zero in the relationship between temperature and frequency. Assume that a frequency of the first oscillator circuit 1 at 25° C. is f1r and a frequency of the second oscillator circuit 2 at 25° C. is f2r, that is, respective values of f1 and f2 at 25° C. are f1r and f2r. The vertical axis values in FIG. 7 are (f1−f1r) and (f2−f2r).

Figure 8:
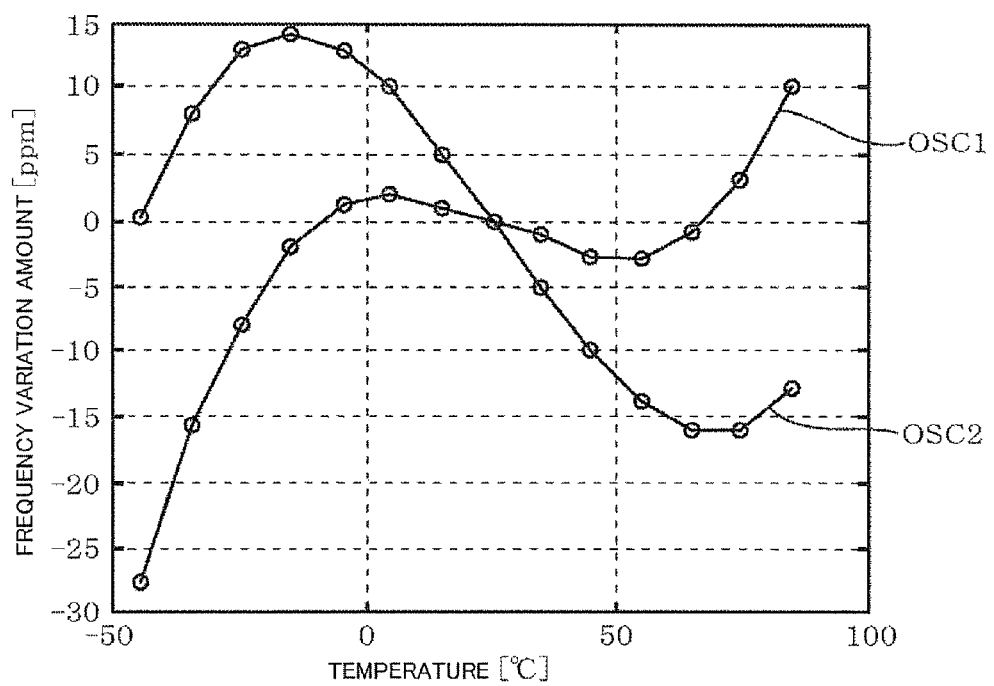
FIG. 8 is a frequency versus temperature characteristic graph illustrating a relationship between: a temperature, and respective values where a variation rate of f1 and a variation rate of f2 are normalized by values at the reference temperature.

FIG. 8 illustrates a variation rate of a frequency at each temperature illustrated in FIG. 7 to a frequency at the reference temperature (25° C.). Accordingly, the vertical axis values in FIG. 8 are (f1−f1r)/f1r and (f2−f2r)/f2r, that is, as described above, OSC1 and OSC2. Here, the unit of the vertical axis value in FIG. 8 is ppm.

Figure 9:
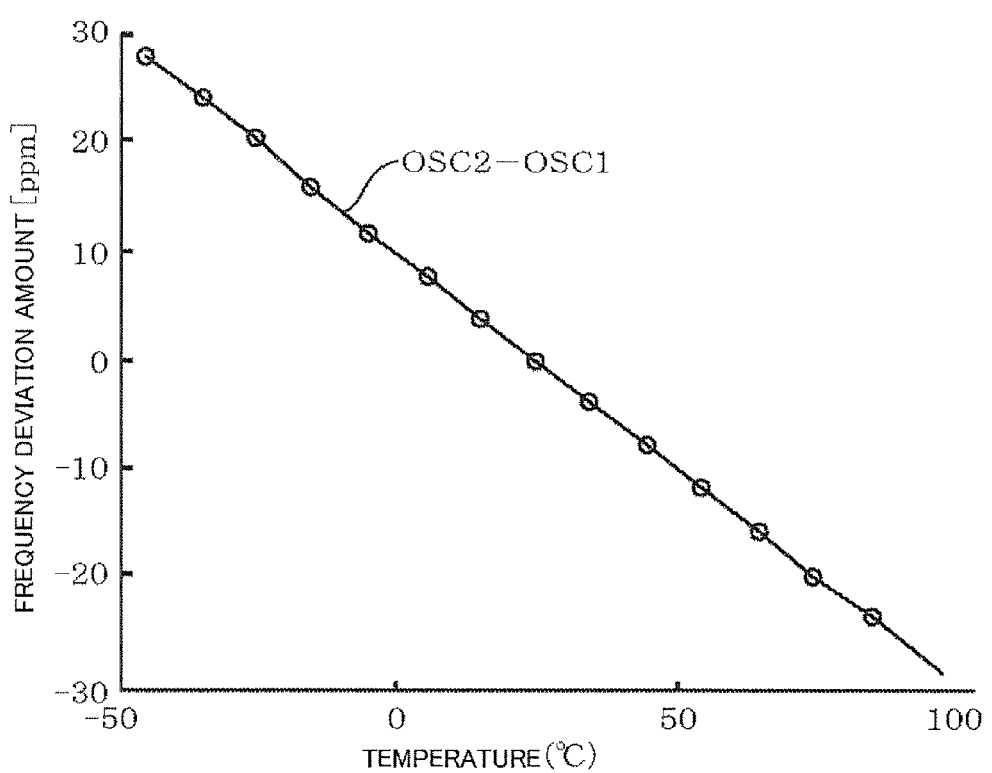
FIG. 9 is a frequency versus temperature characteristic graph illustrating a relationship between: a temperature, and a difference ΔF between a normalized value of a variation rate of f1 by a value at the reference temperature and a normalized value of a variation rate of f2 by a value at the reference temperature.
Figure 10:
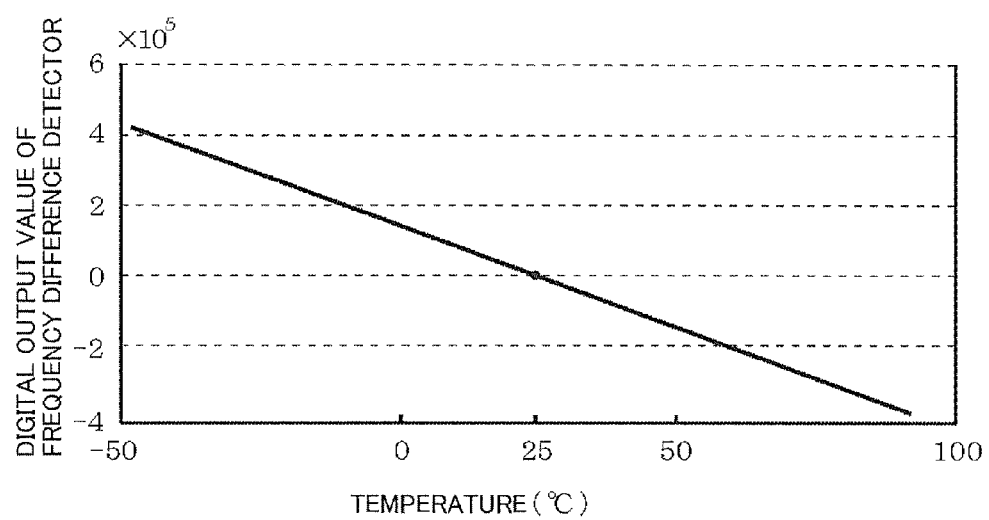
FIG. 10 is a characteristic diagram illustrating a relationship between a digital output value of a frequency difference detector and temperature.

FIG. 9 illustrates a relationship between (OSC2−OSC1) and temperature. FIG. 10 illustrates a relationship between temperature and digital output value of the frequency difference detector 3 corresponding to this (OSC2−OSC1). It can be seen that (OSC2−OSC1) forms a straight line relative to temperature. Accordingly, it can be seen that (OSC2−OSC1) corresponds to a deviation amount of temperature variation from the reference temperature.

Now returning to the description of FIG. 1, an output value of the frequency difference detector 3 is practically (OSC2−OSC1), and this value can be a detection value of the environmental temperature where the crystal units 10 and 20 are placed as illustrated in FIG. 10. Then, an addition unit (a deviation amount extraction circuit) 6 is disposed in the latter part of the frequency difference detector 3. A difference between a temperature setting value, which is a digital signal (a 34-bit digital value of OSC2−OSC1 at set temperature), and OSC2−OSC1, which is an output from the frequency difference detector 3, is extracted. As the set temperature, it is preferred to select a temperature where a value of OSC1 corresponding to the first crystal unit 10 for obtaining the output of the crystal controlled oscillator is not easily changed due to a temperature change. As this temperature, for example, a temperature of 50° C. is selected corresponding to a bottom part in a relational curve between the OSC1 and temperature illustrated in FIG. 8. Note that a temperature of 10° C. may be selected as the set temperature from a viewpoint that the value of OSC1 is the temperature that is not easily changed due to a temperature change. In this case, since the set temperature may be lower than a room temperature, a temperature control unit constituted by combining a heating unit and a cooling unit such as a Peltier device may be disposed.

Further, a loop filter 61 is disposed corresponding to an integration circuit unit in the latter part of the addition unit 6.

Furthermore, a pulse width modulation (PWM) wave interpolation unit 62 is disposed in the latter part of the loop filter 61. The PWM wave interpolation unit 62 performs conversion to represent a 14-bit digital signal (a two's-complement from $-2^{13}$ to $+2^{13}-1$) output from the loop filter 61 as a pulse signal during a certain period of time. For example, when a minimum H pulse width is 10 nsec, the digital signal is represented with a pulse number during the certain period of time of $2^{14}*10^{-9}=16.384$ msec. Specifically, the pulse number is represented as follows. When the 14-bit digital value is zero, the H pulse number during 16.384 msec is $2^{13}$. When the 14-bit digital value is $-2^{13}$, the H pulse number during 16.384 msec is zero. When the 14-bit digital value is $2^{13}-1$, the H pulse number during 16.384 msec is $2^{14}-1$.

A low pass filter (LPF) 63 is disposed in the latter part of the PWM wave interpolation unit 62, and averages an output from the PWM wave interpolation unit 62 to output a DC voltage corresponding to the pulse number as an output of the low pass filter 63. That is, in this example, the PWM wave interpolation unit 62 and the low pass filter 63 are used for converting a digital value into an analog value. A digital/analog converter may be used instead of using the PWM wave interpolation unit 62 and the low pass filter 63.

Figure 11:
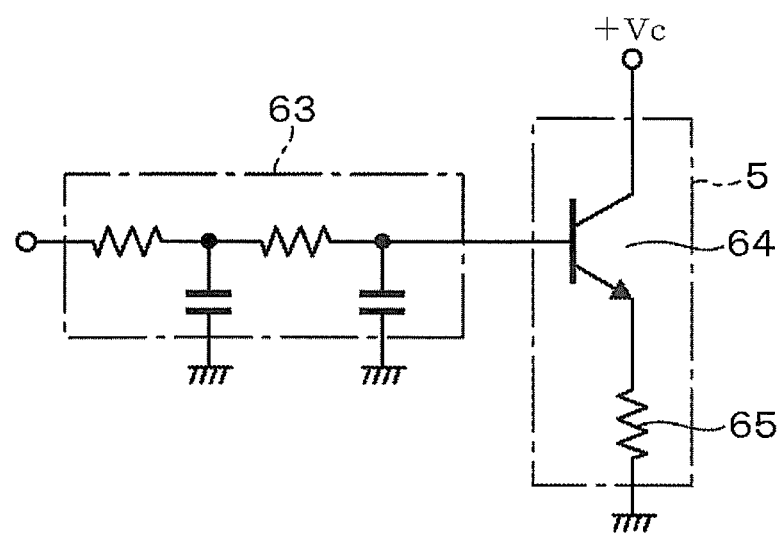
FIG. 11 is a circuit diagram illustrating a control circuit of the heating unit.

A heater circuit 5 corresponding to a heating unit is disposed in the latter part of the low pass filter (LPF) 63. As illustrated in FIG. 11, the heater circuit 5 includes a transistor 64 and a resistor 65. In the transistor 64, an output terminal of the low pass filter 63 connects to a base, and a voltage is supplied to a collector from a power source unit Vc. The resistor 65 is connected between an emitter of the transistor 64 and ground. A relation between: the voltage supplied to the base of the transistor 64, and the total power of power consumption of the transistor 64 and power consumption of the resistor 65 is a linear relationship. Therefore, heating temperature is controlled linearly corresponding to a difference between the temperature data and the set temperature as described above. In this example, since the transistor 64 is also a part of the heating unit, expression of the heater circuit 5 is used to represent both a heater and a heater control circuit.

Figure 12:
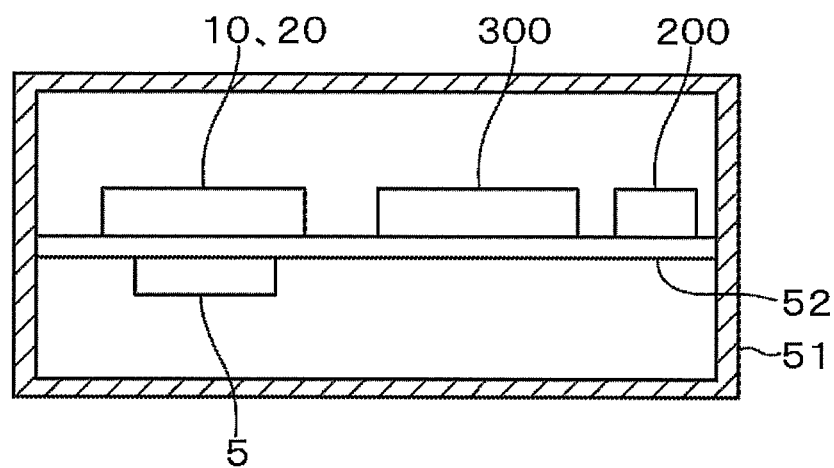
FIG. 12 is a schematic longitudinal cross-sectional side view illustrating a structure of the oscillation device according to the embodiment.

FIG. 12 is a diagram illustrating a schematic structure of the oscillation device illustrated in FIG. 1. Reference numeral 51 denotes a container, and reference numeral 52 denotes a printed circuit board disposed in the container 51. The crystal units 10 and 20, an integrated circuit unit 300, the control circuit unit 200, and similar member are disposed on a top surface side of the printed circuit board 52. The integrated circuit unit 300 is a one-chip unit constituted of a circuit that performs digital processing and includes the oscillator circuits 1 and 2, the frequency difference detector 3, and similar member. On the bottom surface side of the printed circuit board 52, the heater circuit 5 is disposed, for example, in a position corresponding to the crystal units 10 and 20. The crystal units 10 and 20 are held at a set temperature by heat generation of the heater circuit 5. In the example illustrated in FIG. 12, the temperature (the environmental temperature) of the atmosphere where the crystal units 10 and 20 are placed is equivalent to the temperature within the space of the container 51.

The oscillation device according to this embodiment also has a function that performs temperature compensation of the output frequency of the control circuit unit 200 as described above. That is, the oscillation device in this example is a combination of OCXO and TCXO. This function of the temperature compensation is achieved by the crystal units 10 and 20, the oscillator circuits 1 and 2, the frequency difference detector 3, a compensation value obtaining unit 4, and the addition unit 42. That is, the frequency difference detector 3 is a part of unit that controls the temperature of the heater circuit 5, and also has a function that performs temperature compensation.

Specifically, a deviation amount from the set temperature of the heater circuit 5 is extracted from the frequency deviation information of the temperature variation amount obtained by the frequency difference detector 3, integrated at the loop filter 61, and input to the compensation value obtaining unit 41 illustrated in FIG. 1. Here, a frequency compensation value for the frequency setting value of the DDS circuit unit 201 is operated. The frequency deviation information is as already described.

Figure 13:
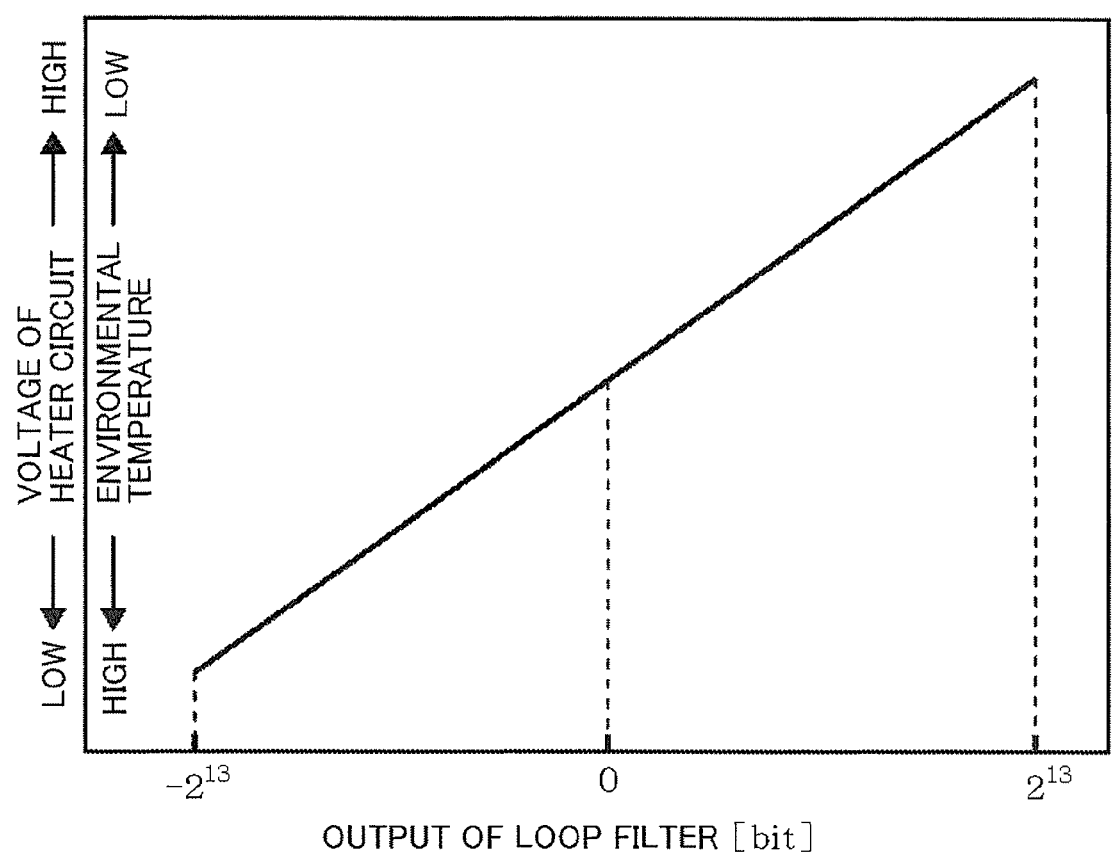
FIG. 13 is a characteristic diagram illustrating a relationship between: an output of a loop filter and a voltage of a heater circuit versus an environmental temperature.

As illustrated in FIG. 9 and FIG. 10, there is a linear relationship between the frequency deviation information (OSC2−OSC1), which is the output of the frequency difference detector 3, and the environmental temperature where the crystal units 10 and 20 are placed. In this respect, the frequency deviation information corresponds to the detection value of the environmental temperature. Next, FIG. 13 shows a relationship between output of the loop filter 61 and environmental temperature. The output of the loop filter 61 is obtained by integrating a result of subtraction of the temperature setting value (OSC2−OSC1 at the set temperature) from the frequency deviation information (at the addition unit 6).

As described above, the output of the loop filter 61 is converted into a DC voltage to be supplied to the heater circuit 5 through the PWM wave interpolation unit 62 and the LPF 63. At this time, as illustrated in FIG. 13, when the output of the loop filter 61 becomes larger, the voltage to be supplied to the heater circuit 5 becomes higher. When the output becomes smaller, the voltage becomes lower. There is a relationship where an adjustment is performed such that the voltage to be supplied to the heater circuit 5 is set higher when the environmental temperature becomes lower, while the voltage to be supplied to the heater circuit 5 is set lower when the environmental temperature becomes higher. These correspondence relationships show that there is a linear relationship also between the output of the loop filter 61 and the environmental temperature.

Figure 14:
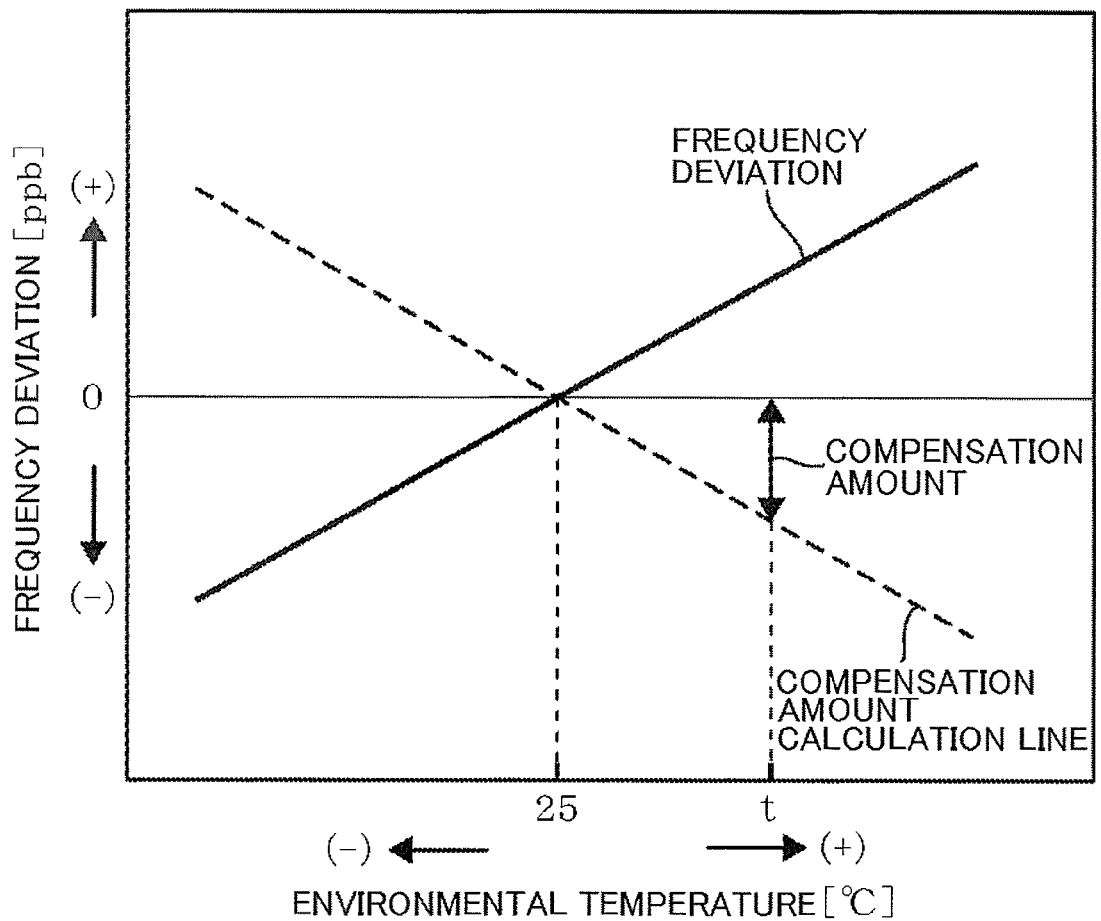
FIG. 14 is a characteristic diagram illustrating a relationship between an output frequency and the environmental temperature where crystal units are placed.

On the other hand, FIG. 14 schematically illustrates a temperature characteristic of the output frequency from the control circuit unit 200 during change in environmental temperature where the crystal units 10 and 20 are placed. In practice, the vertical axis in FIG. 14 denotes a variation rate ((f−fr)/fr) of the frequency deviation from the output frequency at the reference temperature (25° C.).

According to the result illustrated in FIG. 14, the change in environmental temperature where the crystal units 10 and 20 are placed changes the output frequency from the control circuit unit 200. This shows that the relationship between the environmental temperature and the output frequency (the frequency deviation) also can be approximated almost by a straight line. This may be caused by that the oscillation frequency of the first oscillator circuit 1 changes corresponding to the change in environmental temperature, the frequency signal of the oscillation frequency is input to the DDS circuit unit 201 as the clock signal, and then the frequency of the reference signal output from the DDS circuit unit 201 is changed.

The oscillation device in this embodiment compensates a frequency setting value to be input to the DDS circuit unit 201, so as to cancel the change in output frequency due to the change in environmental temperature where the crystal units 10 and 20 are placed. In this example, a method for obtaining the frequency compensation value to compensate the frequency setting value employs the linear relationships illustrated in FIG. 13 and FIG. 14. That is, in the case where the environmental temperature where the crystal units 10 and 20 are placed and the output frequency (the frequency deviation) of the control circuit unit 200 have a linear relationship (in FIG. 14), and in the case where the environmental temperature and the output of the loop filter 61 have a linear relationship (in FIG. 13), this output frequency also has a linear relationship with the output of the loop filter 61.

Here, the DDS circuit unit 201 stores amplitude data of a sawtooth wave and a sine wave in the memory corresponding to respective addresses on a waveform table, and reads out the amplitude data in synchronization with the clock signal obtained from the first oscillator circuit 1 to output the reference signal. At this time, a skip width of the address on the waveform table is increased and decreased based on the frequency setting value obtained from the memory 30, so as to output the reference signal with a frequency corresponding to the frequency setting value. Therefore, change in oscillation frequency of the clock signal changes the period at which the amplitude data is read out from the waveform table. Accordingly, the reference signal with a frequency corresponding to the frequency setting value is not obtained.

Therefore, the oscillation device in this example employs the linear relationship between the frequency deviation of the clock signal output from the first oscillator circuit 1 and the output of the loop filter 61, multiplies the output of the loop filter 61 by a proper gain, and then compensates the frequency setting value of the DDS circuit unit 201. This cancels an influence of the change in environmental temperature on the output frequency. The compensation of the frequency setting value changes the skip width of the address on the waveform table, so as to operate the PLL of the control circuit unit 200 in a state similar to that of the case where the environmental temperature is held constant.

As means for compensating the above-described frequency setting value, this oscillation device includes the compensation value obtaining unit 41 and the addition unit 42.

The compensation value obtaining unit 41 receives the output of the loop filter 61 to obtain the frequency compensation value. The addition unit 42 adds the frequency compensation value obtained by the compensation value obtaining unit 41 to the frequency setting value.

Figure 15:
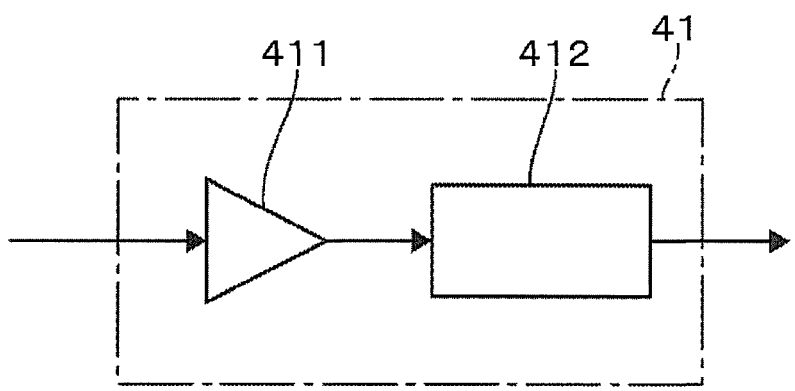
FIG. 15 is a block diagram illustrating a compensation value obtaining unit.

As illustrated in FIG. 15, the compensation value obtaining unit 41 includes an amplifier 411 and a decimation filter 412. The amplifier 411 multiplies the 14-bit digital signal output from the loop filter 61 by a predetermined gain. The decimation filter 412 decimates the output of the amplifier 411 at a predetermined interval, and then outputs the decimated output to the addition unit 42.

The amplifier 411 inverts the sign of the digital signal to add the frequency compensation value proportional to a compensation amount calculation line (illustrated by a dashed line in this drawing), so as to cancel a solid line of the frequency deviation illustrated in FIG. 14. The compensation amount calculation line is symmetrical with respect to the horizontal axis at a position where the frequency deviation is zero. The size of the gain of the amplifier 411 is adjusted to a size that allows oscillation of the output frequency similar to that in the case where an accurate clock signal is input when the frequency compensation value is added to the frequency setting value.

Therefore, in order to prevent the situation that large compensation of the frequency setting value frequently results in rapid variation in output frequency in the case where the environmental temperature is rapidly changed, the decimation filter 412 in the latter part decimates the output of the frequency compensation value at a predetermined interval and smoothes large variation such that the interval for adding the frequency compensation value to the frequency setting value at the addition unit 42 becomes longer than the interval for outputting the digital signal.

Next, the entire operation of the above-described embodiment will be summarized. If attention is focused on the crystal controlled oscillator of the oscillation device, the output of the crystal controlled oscillator is equivalent to the frequency signal output from the first oscillator circuit 1. Then, the environmental temperature where the crystal units 10 and 20 are placed is heated to the set temperature by the heater circuit 5. The first crystal unit 10 and the first oscillator circuit 1 generate the frequency signal that is the output of the crystal controlled oscillator, and also function as a temperature detecting unit together with the second crystal unit 20 and the second oscillator circuit 2. The value of OSC2−OSC1 corresponding to the frequency difference between the respective frequency signals obtained from the oscillator circuits 1 and 2 corresponds to the environmental temperature where the crystal units 10 and 20 are placed as described above. A difference between this value of OSC2-OSC1 and the temperature setting value (for example, a value of OSC2−OSC1 at 50° C.) is extracted by the addition unit 6.

This difference is integrated by the loop filter 61, and then converted into a DC voltage to adjust a control power for the heater circuit 5. As seen in the characteristic diagram illustrated in FIG. 10, assuming that the value of OSC2−OSC1 at 50° C. is $-1.5 \times 10^5$, the output of the addition unit 6 is a positive value when the temperature is lower than 50° C. and increases as the temperature decreases. Accordingly, the operation of the loop filter 61 that outputs an integrated value at this value increases a voltage (a control power) supplied to the heater circuit 5 as the environmental temperature where the crystal units 10 and 20 are placed become lower than 50° C. When the environmental temperature is higher than 50° C., the output of the addition unit 6 has a negative value. The integration of this value increases the absolute value of the output of the loop filter 61 as the temperature is increased. Therefore, with the operation, a supply power to the heater is decreased as the environmental temperature becomes higher than 50° C. This is likely to maintain the environmental temperature where the crystal units 10 and 20 are placed at the set temperature of 50° C., thus stabilizing the oscillation frequency of the first oscillator circuit 1 as an oscillation output. This consequently stabilizes the frequency of the reference signal to be supplied to the phase frequency comparator 205 in the control circuit unit 200 where the output from the first oscillator circuit 1 is used as the clock signal. Therefore, the output frequency from the voltage control oscillator 100 is also stabilized as the output of the oscillation device (the frequency synthesizer).

The integrated value of the loop filter 61 is also output to the compensation value obtaining unit 41, and the gain is adjusted inside of the amplifier 411. Subsequently, the decimation filter 412 performs decimation at the output interval, and the integrated value is added to the frequency setting value by the addition unit 42.

As illustrated in FIG. 1, the first crystal unit 10 and the second crystal unit 20 are constituted of the common crystal element Xb and are thermally connected to each other. Therefore, the frequency difference between the oscillator circuits 1 and 2 is a value corresponding to the environmental temperature extremely accurately. Accordingly, the output of the frequency difference detector 3 is information that indicates a temperature difference between the environmental temperature where the crystal units 10 and 20 are placed and the reference temperature (25° C. in this example). Therefore, the output of the addition unit 6 obtained by subtracting the temperature setting value (OSC2−OSC1 at the set temperature) from this temperature detection value becomes the information that indicates the difference between the environmental temperature and the set temperature (50° C. in this example). The output of the loop filter 61 obtained by integrating this value becomes information corresponding to the environmental temperature.

On the other hand, the frequency signal f1 output from the first oscillator circuit 1 is used as a main clock of the control circuit unit 200. Therefore, the frequency compensation value obtained by adjusting the gain of the output of the loop filter 61 at the compensation value obtaining unit 41 is used as a signal for compensating the operation of the control circuit unit 200 so as to cancel the influence on the operation of the control circuit unit 200 based on the frequency deviation amount of f1 by the environmental temperature deviating from the set temperature of the heater circuit 5. As a result, as the output of the oscillation device of this embodiment, the output frequency of the voltage control oscillator 100 is stabilized regardless of the temperature variation.

As described above, with the above-described embodiment, the difference between both values corresponding to the respective frequency differences in frequency signals obtained from the crystal units 10 and 20 is used as the temperature detection value. The integration of the difference between this temperature detection value and the set temperature obtains information corresponding to the environmental temperature of the crystal units 10 and 20. This value is used as the frequency compensation value of the frequency setting value input to the DDS circuit unit 201 of the control circuit unit 200 constituting the PLL based on assuming that the value has a linear relationship with a deviation in output frequency by the environmental temperature deviating from the set temperature (50° C. in this example) of the heater circuit 5. This is nothing but performing temperature compensation of the output frequency output from the control circuit unit 200.

Thus, since the frequency synthesizer has the functions of both OCXO and TCXO, there are the following advantages. Although a manufacturer determines a usage temperature range of the frequency synthesizer, an output frequency is stable even when a user uses the frequency synthesizer in an environment out of the determined usage temperature range. In the case where the set temperature of the heater is set higher to raise an upper limit of the usage temperature range, the power consumption of the heater increases and the size of the heating circuit also increases. Use of the function of TCXO has an advantage that reduces the power consumption of the heater by.

In the above-described example, since the third overtone of each of the crystal units 10 and 20 is obtained as an oscillation frequency, and the frequency versus temperature characteristics of the overtones have a large temperature change. Therefore, the value corresponding to differences from these frequencies is highly sensitive to the temperature, and this is a preferable aspect. However, each fundamental wave of the crystal units 10 and 20 may be obtained as the oscillation frequency, and the value corresponding to differences from these frequencies may be used as the temperature value. Alternatively, the fundamental wave and the overtone may be respectively obtained from one unit and the other unit among the crystal units 10 and 20, and the value corresponding to differences from these frequencies may be treated as the temperature value.

Moreover, in order to obtain the frequency difference detection information, the PLL is configured to perform as follows. The pulse corresponding to the difference frequency between f1 and f2 is created. The sawtooth wave signal output from the DDS circuit unit is latched by the latch circuit based on the pulse. The latched signal value is integrated to output this integrated value as the frequency difference. The difference between: this output, and the value corresponding to the difference between f1r and f2r is obtained to be input into the DDS circuit unit. As disclosed in Japanese Unexamined Patent Application No. 2001-292030, in the case where f1 and f2 are counted to obtain a difference between the counts, the count time directly influences on the detection accuracy. However, in the configuration of this embodiment, there is not such problem. Therefore, detection accuracy is high. Actually, both the methods are compared one another through simulation, and a count time of 200 ms is set in the method for counting the frequencies. This results in that the detection accuracy in the method of this embodiment is about 50 times higher than that of the other methods.

The frequency difference detector 3 may also use the difference value between (f1−f1r) and (f2−f2r) itself, as the value corresponding to the difference value between: the value corresponding to the difference between f1 and f1r, and the value corresponding to the difference between f2 and f2r. In this case, the graph in FIG. 7 is utilized to obtain the temperature.

In the above-described embodiment, in FIG. 8 and FIG. 9, the change amount of the frequency is indicated in the unit of "ppm". However, since all values are treated as a binary number in an actual digital circuit, frequency setting accuracy of the DDS circuit unit 36 is calculated by the number of configuration bits, for example, 34 bits. Taking one example, in the case where a clock of 10 MHz is supplied to the DDS circuit unit 201 included in the control circuit unit 200 illustrated in FIG. 1, and a variable frequency of the clock is 100 Hz, the followings are satisfied.

(Variable Ratio Calculation)

$$100 \text{ Hz}/10 \text{ MHz} = 0.00001$$

(ppm Conversion)

$$0.00001 * 10^6 = 10 \text{ (ppm)}$$

(DDS Setting Accuracy Conversion)

$$0.00001 * 2^{34} \approx 171{,}799 \text{(ratio-34 bit(tentative name))}$$

In the above-described configuration, the frequency setting accuracy can be represented by the following expression (1).

$$1 \times (\text{ratio-34 bit}) = 10 \text{ M(Hz)}/2^{34} \approx 0.58 \text{ m(Hz/bit)} \quad (1)$$

Therefore, 100 (Hz)/0.58 m (Hz/bit) 171,799 (bit (ratio-34 bit)) is satisfied.

Further, 0.58 mHz can be calculated with respect to 10 MHz as the following expression (2).

$$0.58 \text{ m(Hz)}/10 \text{ M(Hz)} * 10^9 \approx 0.058 \text{ (ppb)} \quad (2)$$

Therefore, a relationship of expression (3) is satisfied based on the expressions (1) and (2).

$$10^9/2^{34} = 0.058 \text{ (ppb/ratio-34 bit)} \quad (3)$$

That is, the frequency processed in the DDS circuit unit 36 is eliminated, and this expression has a relationship with only the number of bits.

The method for extracting the frequency compensation value at the compensation value obtaining unit 41 is not limited to the method described using FIG. 13 to FIG. 15. For example, in the case where it is difficult to correlate the output of the loop filter 61 with the frequency deviation by approximation with a straight line, a high-order approximation curve, and similar curve may be used for correlation of these parameters. A table indicating a correlation between the output of the loop filter 61 and the frequency deviation may be preliminarily stored in a memory to obtain the frequency compensation value based on the correlation curve or the correlation table of these parameters.

Furthermore, in the above-described example, the first crystal unit 10 and the second crystal unit 20 use the common crystal element Xb. However, the crystal element Xb might not be used in common. In this case, as an example, the first crystal unit 10 and the second crystal unit 20 are disposed in a common casing. With this configuration, the first crystal unit 10 and the second crystal unit 20 are placed under substantially the same temperature environment, thus providing a similar effect.

The output signal of the DDS circuit unit 36 of the frequency difference detector 3 is not limited to the sawtooth wave insofar as the output signal is a frequency signal with a signal value that repeatedly increases and decreases with time. For example, the output signal may be a sine wave. The frequency difference detector 3 may also be configured to count f1 and f2 by a counter, subtract a value corresponding to Afr from a difference value between the count values, and output a value corresponding to the obtained count value.

In the above-described embodiment, the first crystal unit 10 and the first oscillator circuit 1 has a function for extracting the temperature detection value and a function for creating the output of the crystal controlled oscillator. That is, the oscillator circuit 1 functions as the oscillator circuit for detecting the temperature and the oscillator circuit for outputting the crystal controlled oscillator. However, in the present disclosure, for example, three crystal units and three oscillator circuits may be prepared. For example, in the configuration of FIG. 1, a third crystal unit and a third oscillator circuit, which is connected to this crystal unit, are prepared. An output of the third oscillator circuit is set as an output of the crystal controlled oscillator. Oscillation outputs of remaining first oscillator circuit and second oscillator circuit are input to the frequency difference detector to obtain a temperature detection value. In this case, if OCXO and TCXO are combined, the output of the third oscillator circuit is used as a clock signal of the DDS circuit unit 201.

Working Example

Figure 16:
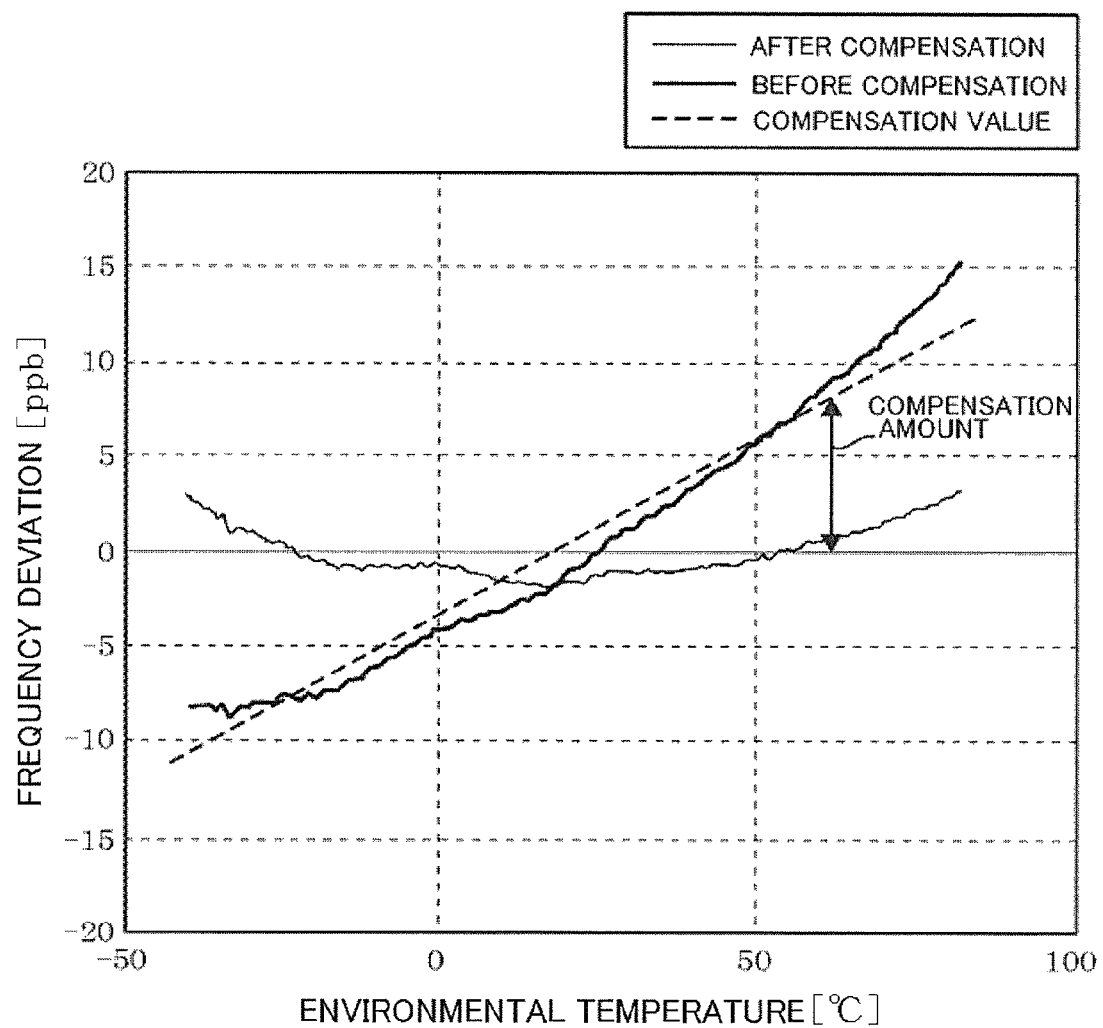
FIG. 16 is a temperature characteristic diagram illustrating an output frequency from a control circuit unit.

The change in output frequency (frequency deviation from the reference temperature) from the control circuit unit 200 was simulated while varying the environmental temperature where the crystal unit connected to the oscillator circuit for outputting a clock was placed.
A. Simulation Conditions
Assume that the oscillation frequency of the oscillator circuit was 84.6 MHz, the output frequency of the control circuit unit 200 was 19.2 MHz (where a dividing ratio N=124, the frequency setting value of the DDS circuit unit 201 is 154.83 kHz). A model of the oscillation device was created to confirm an influence on the output frequency while varying the environmental temperature where the crystal unit was placed.
B. Simulation Result
FIG. 16 illustrates a simulation result. In the graph, the horizontal axis denotes the environmental temperature (° C.), the vertical axis denotes output frequency deviation ((f−fr)/fr where f is an output frequency and fr denotes the output frequency at the reference temperature (25° C.)) (ppb). In the drawing, the thick line denotes output frequency deviation (before compensation), the dashed line denotes an approximate straight line of the frequency deviation (a compensation value), and the thin line denotes a result of subtracting the value of the approximate straight line for each temperature as a compensation amount from the output frequency deviation (after compensation).

With the result illustrated in FIG. 16, subtraction of the compensation value approximated by a straight line from the frequency deviation, which is approximately −10 to +15 (ppb) before compensation, makes the frequency deviation after compensation to a value within a range from approximately −2 to +3 (ppb). This shows that the method for compensating the frequency deviation with an appropriate straight line is effective, and use of the output of the loop filter 61 in a linear relationship with the environmental temperature allows the improvement of the frequency deviation.

What is claimed is:
1. An oscillation device, comprising:
a main circuit portion that includes a phase locked loop, the main circuit portion is configured to generate an oscillation output of the oscillation device corresponding to a frequency setting value, the phase locked loop using an output of an oscillator circuit for outputting a clock as a clock signal, the oscillator circuit being connected to a crystal unit;
a heating unit, configured to ensure a constant temperature of an atmosphere where the crystal unit is placed;
a first crystal unit, including a crystal element where a first electrode is disposed;
a second crystal unit, including a crystal element where a second electrode is disposed;
a first oscillator circuit, being connected to the first crystal unit;
a second oscillator circuit, being connected to the second crystal unit;
a frequency difference detector, configured to obtain, as a temperature detection value, a value corresponding to a difference value between: a value corresponding to a difference between f1 and f1r; and a value corresponding to a difference between f2 and f2r, where f1 is an oscillation frequency of the first oscillator circuit, f1r is an oscillation frequency of the first oscillator circuit at a reference temperature, f2 is an oscillation frequency of the second oscillator circuit, and f2r is an oscillation frequency of the second oscillator circuit at the reference temperature;
a first addition unit, configured to extract a deviation amount between a temperature setting value of the heating unit and the temperature detection value;
an integration circuit unit, configured to integrate a deviation amount extracted by the first addition unit and output an integration result;
a circuit unit, configured to control an electric power to be supplied to the heating unit based on an integrated value output from the integration circuit unit;
a compensation value obtaining unit, configured to obtain a frequency compensation value for compensating an output frequency of the main circuit portion based on an integrated value output from the integration circuit unit, and based on a change in the clock signal due to a difference between the temperature of the atmosphere and the temperature setting value of the heating unit; and
a second addition unit, configured to add the frequency compensation value to the frequency setting value.
2. The oscillation device according to claim 1, wherein the oscillator circuit for outputting the clock also functions as one of the first oscillator circuit and the second oscillator circuit.
3. The oscillation device according to claim 1, wherein the value corresponding to the difference value between: the value corresponding to the difference between f1 and f1r; and the value corresponding to the difference between f2 and f2r, is {(f2−f2r)/f2r}−{(f1−f1r)/f1r}.
4. The oscillation device according to claim 1, wherein the first oscillator circuit and the second oscillator circuit each output an overtone as the oscillation output.
5. The oscillation device according to claim 1, wherein the main circuit portion includes: a direct digital synthesizer circuit unit,
the direct digital synthesizer circuit unit is configured to output a frequency signal to a phase frequency comparator of the phase locked loop,
the frequency signal being generated based on the clock signal and the compensated frequency setting value.
6. The oscillation device according to claim 1, wherein the compensation value obtaining unit is configured to decimate the output of the frequency compensation value at a predetermined interval, such that an interval to add the frequency compensation value to the frequency setting value by the second addition unit becomes longer than an interval to output the integrated value by the integration circuit unit.
7. The oscillation device according to claim 1, wherein the heating unit includes: a transistor,
the transistor includes:
a collector, being connected to a power source unit;
a base, to which an electric power is supplied, the electric power being output from the circuit unit configured to control the electric power; and
an emitter, being grounded via a resistor.
8. The oscillation device according to claim 1, wherein the first crystal unit and the second crystal unit are disposed at a common crystal element.

9. The oscillation device according to claim 1, wherein
the crystal unit and the oscillator circuit for outputting the clock are constituted of any one combination of: the first crystal unit and the first oscillator circuit, and the second crystal unit and the second oscillator circuit.

10. The oscillation device according to claim 1, wherein
the crystal unit for outputting the clock is constituted of an AT-cut crystal element, and the temperature setting value is set to an extreme value of a curve showing a relationship between: a temperature and a frequency variation at one of the first crystal unit and the second crystal unit.

11. The oscillation device according to claim 1, wherein
the compensation value obtaining unit is configured to: approximate the integrated value output from the integration circuit unit and the output frequency of the main circuit portion by a linear relationship; and obtain the frequency compensation value by multiplying the integrated value by a predetermined gain, the predetermined gain being used to cancel an output frequency deviation due to a difference between the temperature of the atmosphere and the temperature setting value of the heating unit.

* * * * *